US008130038B2

(12) United States Patent
Chang et al.

(10) Patent No.: US 8,130,038 B2
(45) Date of Patent: Mar. 6, 2012

(54) CLASS AB OPERATIONAL AMPLIFIER AND OUTPUT STAGE QUIESCENT CURRENT CONTROL METHOD

(75) Inventors: Ming-Hung Chang, Hsinchu County (TW); Che-Hung Lin, Chiayi (TW)

(73) Assignee: Anpec Electronics Corporation, Hsinchu Science Park, Hsin-Chu (TW)

(*) Notice: Subject to any disclaimer, the term of this patent is extended or adjusted under 35 U.S.C. 154(b) by 0 days.

(21) Appl. No.: 12/854,158

(22) Filed: Aug. 10, 2010

(65) Prior Publication Data
US 2012/0007677 A1  Jan. 12, 2012

(30) Foreign Application Priority Data

Jul. 7, 2010  (TW) .............................. 99122341 A

(51) Int. Cl.
*H03F 3/26* (2006.01)
(52) U.S. Cl. ........................................ 330/267; 330/255
(58) Field of Classification Search .................. 330/253, 330/255, 261, 267
See application file for complete search history.

(56) References Cited

U.S. PATENT DOCUMENTS

| 6,356,153 | B1 * | 3/2002 | Ivanov et al. ................. 330/255 |
| 6,556,081 | B2 | 4/2003 | Muza |
| 7,304,538 | B2 * | 12/2007 | Song ............................. 330/264 |
| 7,898,330 | B2 * | 3/2011 | Eschauzier et al. ........... 330/255 |
| 2008/0036538 | A1 * | 2/2008 | Lee ................................. 330/255 |
| 2009/0002070 | A1 * | 1/2009 | Swanson ....................... 330/267 |

* cited by examiner

*Primary Examiner* — Khanh Nguyen
(74) *Attorney, Agent, or Firm* — Winston Hsu; Scott Margo

(57) ABSTRACT

A class AB operational amplifier includes: a first transistor, for generating a first current; a second transistor, where a second source voltage of the second transistor is equal to a first source voltage of the first transistor, for generating an output stage quiescent current; and an output stage quiescent current controller, coupled to a gate and a source of the first transistor, for controlling a first drain-to-source voltage of the first transistor to be equal to a second drain-to-source voltage of the second transistor. A ratio of the output stage quiescent current to the first current is equal to a ratio of a second W/L ratio of the second transistor to a first W/L ratio of the first transistor.

10 Claims, 7 Drawing Sheets

CLASS AB OPERATIONAL AMPLIFIER AND OUTPUT STAGE QUIESCENT CURRENT CONTROL METHOD

BACKGROUND OF THE INVENTION

1. Field of the Invention

The present invention relates to a class AB operational amplifier and output stage quiescent current control method, and more particularly, to a class AB operational amplifier and output stage quiescent current control method capable of reducing variation of an output stage quiescent current due to process variation and bias variation.

2. Description of the Prior Art

An output stage quiescent current relates to an output stage current when no signal is inputted into an operational amplifier, and is generally maintained within a stable range to meet system requirements. In the prior art, the output stage quiescent current is generally maintained at a specific multiple of a bias current by negative feedback.

Please reference FIG. 1, which is a schematic diagram of a class AB operational amplifier 10 in the prior art. The class AB operational amplifier 10 includes input terminals Vin−, Vin+, transistors M1, M2, a current source 102 and a comparator 104. In short, since input voltages of the comparator 104 are a gate voltage Vg1 of the transistor M1 and a gate voltage Vg2 of the transistor M2, and sources of both the transistors M1, M2 are connected to a system voltage VDD, the comparator 104 can perform negative feedback to make a gate-to-source voltage Vgs1 of the transistor M1 equal to a gate-to-source voltage Vgs2 of the transistor M2. As a result, when no signal is inputted into the input terminals Vin−, Vin+, a ratio of an output stage quiescent current IQ to a bias current Id2 supplied by the current source 102 is substantially equal to a ratio of a W/L ratio $(W/L)_1$ of the transistor M1 to a W/L ratio $(W/L)_2$ of the transistor M2.

In detail, a current Id of a transistor is generally denoted as follows:

$$Id = \frac{1}{2}\mu_n Cox \frac{W}{L}(Vgs - V_T)^2(1 + \lambda Vds), \qquad \text{(Eq. 1)}$$

where $\lambda$ is a process variation parameter for denoting a channel length modulation effect, i.e. when a drain-to-source voltage is higher than a saturation voltage, an effective length of the transistor is shorter than an actual length L, such that the current Id is increased.

Then, Eq. 1 can be rewritten as follows:

$$Vgs = V_T + \sqrt{\frac{2Id}{\mu_n Cox \frac{W}{L}(1 + \lambda Vds)}}, \qquad \text{(Eq. 2)}$$

Since the gate-to-source voltage Vgs1 is equal to the gate-to-source voltage Vgs2, a relation between the output stage quiescent current IQ and the bias current Id2 can be denoted as follows:

$$\sqrt{\frac{IQ}{\left(\frac{W}{L}\right)_1(1 + \lambda Vds1)}} = \sqrt{\frac{Id2}{\left(\frac{W}{L}\right)_2(1 + \lambda Vds2)}}, \qquad \text{(Eq. 3)}$$

Since the gate voltage Vg2 is equal to a source voltage Vd2 in the transistor M2, Eq. 3 can be rewritten as follows:

$$IQ = \frac{\left(\frac{W}{L}\right)_1(1 + \lambda Vds1)}{\left(\frac{W}{L}\right)_2(1 + \lambda Vds2)}Id2 = \frac{\left(\frac{W}{L}\right)_1}{\left(\frac{W}{L}\right)_2}\frac{(1 + \lambda Vds1)}{(1 + \lambda Vgs2)}Id2, \qquad \text{(Eq. 4)}$$

However, since a source voltage Vd1 of the transistor M1, i.e. an output voltage, is half the system voltage VDD when no signal is inputted into the input terminals Vin−, Vin+, a drain-to-source voltage Vds1 of the transistor M1 is also half the system voltage VDD, i.e. about 2.5V, while the gate-to-source voltage Vgs2 is generally about 0.8V. As a result, as can be seen from Eq. 4, when the system voltage VDD rises, the drain-to-source voltage Vds1 rises as well, while the gate-to-source voltage Vgs2 remains unchanged, such that the output stage quiescent current IQ is increased. In addition, both the gate-to-source voltage Vgs2 and the process variation parameter $\lambda$ vary with process variation. Thus, the output stage quiescent current IQ becomes greater when both the gate-to-source voltage Vgs2 and the process variation parameter $\lambda$ become smaller, while the output stage quiescent current IQ becomes smaller when both the gate-to-source voltage Vgs2 and the process variation parameter $\lambda$ become greater. In other words, the class AB operational amplifiers 10 under the same process conditions have wider distribution of the output stage quiescent currents IQ, i.e. statistically larger standard deviation.

As can be seen from the above, in the prior art, the ratio of the output stage quiescent current IQ to the bias current Id2 is not purely equal to the ratio of the W/L ratio $(W/L)_1$ to the W/L ratio $(W/L)_2$, and varies with process variation and the system voltage VDD as well, i.e. channel length modulation effect, such that the output stage quiescent current IQ cannot be maintained within the stable range. Thus, there is a need for improvement in the prior art.

SUMMARY OF THE INVENTION

It is therefore an objective of the present invention to provide a class AB operational amplifier and output stage quiescent current control method.

The present invention discloses a class AB operational amplifier. The class AB operational amplifier includes: a first transistor, for generating a first current; a second transistor, where a second source voltage of the second transistor is equal to a first source voltage of the first transistor, for generating a output stage quiescent current; and an output stage quiescent current controller, coupled to a gate and a source of the first transistor, for controlling a first drain-to-source voltage of the first transistor to be equal to a second drain-to-source voltage of the second transistor. A ratio of the output stage quiescent current to the first current is equal to a ratio of a second W/L ratio of the second transistor to a first W/L ratio of the first transistor.

The present invention further discloses an output stage quiescent current control method for a class AB operational amplifier. The output stage quiescent current control method includes steps of controlling a first drain-to-source voltage of a first transistor to be equal to a second drain-to-source voltage of a second transistor, and utilizing the second transistor to generate an output stage quiescent current. A second source voltage of the second transistor is equal to a first source voltage of the first transistor, and a ratio of the output stage quiescent current to a first current generated by the first transistor is equal to a ratio of a second W/L ratio of the second transistor to a first W/L ratio of the first transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
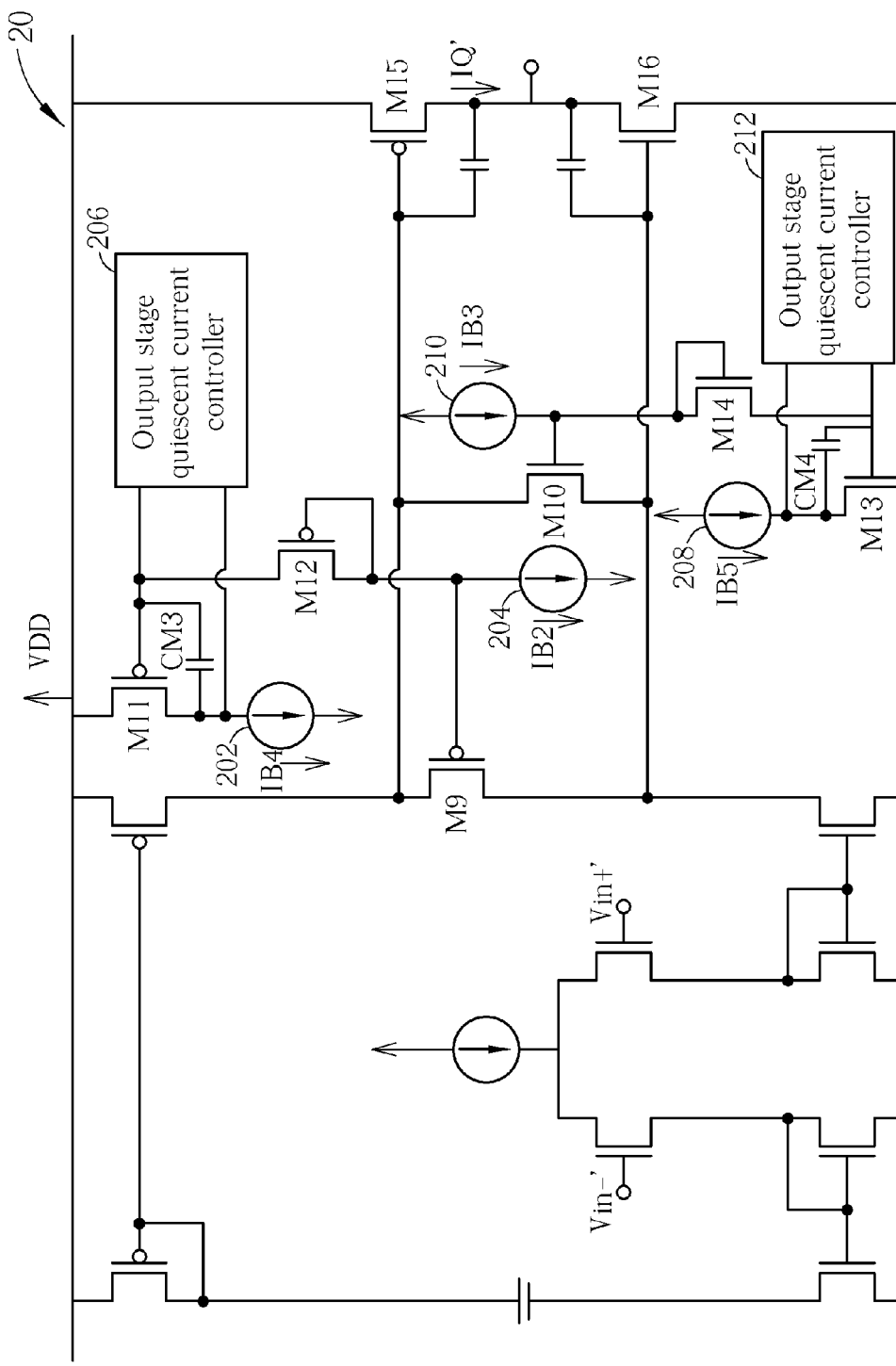
FIG. 2 is a schematic diagram of a class AB operational amplifier according to an embodiment of the present invention.

Please reference FIG. 2, which is a schematic diagram of a class AB operational amplifier 20 according to an embodiment of the present invention. The class AB operational amplifier 20 includes input terminals Vin−', Vin+', transistors M9, M11, M12, M15, current sources 202, 204 and an output stage quiescent current controller 206. In short, a gate-to-source voltage Vgs11 of the transistor M11 is made equal to a gate-to-source voltage Vgs15 of the transistor M15 by matching the transistors M9, M12. The output stage quiescent current controller 206 controls a drain-to-source voltage Vds11 of the transistor M11 to be equal to a drain-to-source voltage Vds15 of the transistor M15. In such a situation, when no signal is inputted into the input terminals Vin−', Vin+', a ratio of the output stage quiescent current IQ' generated by the transistor M15 to a bias current IB4 generated by the transistor M11 is equal to a ratio of a W/L ratio $(W/L)_{15}$ of the transistor M15 to a W/L ratio $(W/L)_{11}$ of the transistor M11, which reduces variation of the output stage quiescent current IQ' due to variation of the system voltage VDD and process variation, so as to maintain the output stage quiescent current IQ' within a stable range.

In detail, as can be seen from FIG. 2, a sum of the gate-to-source voltage Vgs11 of the transistor M11 and a gate-to-source voltage Vgs12 of the transistor M12 is equal to a sum of the gate-to-source voltage Vgs15 of the transistor M15 and a gate-to-source voltage Vgs9 of the transistor M9, i.e. Vgs11+Vgs12=Vgs9+Vgs15. Therefore, by matching the transistors M9, M12 to make the gate-to-source voltage Vgs12 equal to the gate-to-source voltage Vgs9, i.e. Vgs12=Vgs9, the gate-to-source voltage Vgs11 can be equal to the gate-to-source voltage Vgs15, i.e. Vgs11=Vgs15. Thus, a result similar to Eq. 4 can be derived as follows:

$$IQ' = \frac{\left(\frac{W}{L}\right)_{15}(1 + \lambda Vds15)}{\left(\frac{W}{L}\right)_{11}(1 + \lambda Vds11)} IB4, \quad \text{(Eq. 5)}$$

In addition, since the output stage quiescent current controller 206 controls the drain-to-source voltage Vds11 to be equal to the drain-to-source voltage Vds15, Eq. 5 can be further simplified as follows:

$$IQ' = \frac{\left(\frac{W}{L}\right)_{15}}{\left(\frac{W}{L}\right)_{11}} IB4, \quad \text{(Eq. 6)}$$

As a result, as can be seen from Eq. 6, the ratio of the output stage quiescent current IQ' to the bias current Id2 is purely equal to the ratio of the W/L ratio $(W/L)_{15}$ to the W/L ratio $(W/L)_{11}$, which reduces variation of the output stage quiescent current IQ' due to variation of the system voltage VDD and process variation, so as to maintain the output stage quiescent current IQ' within a stable range.

Figure 3:
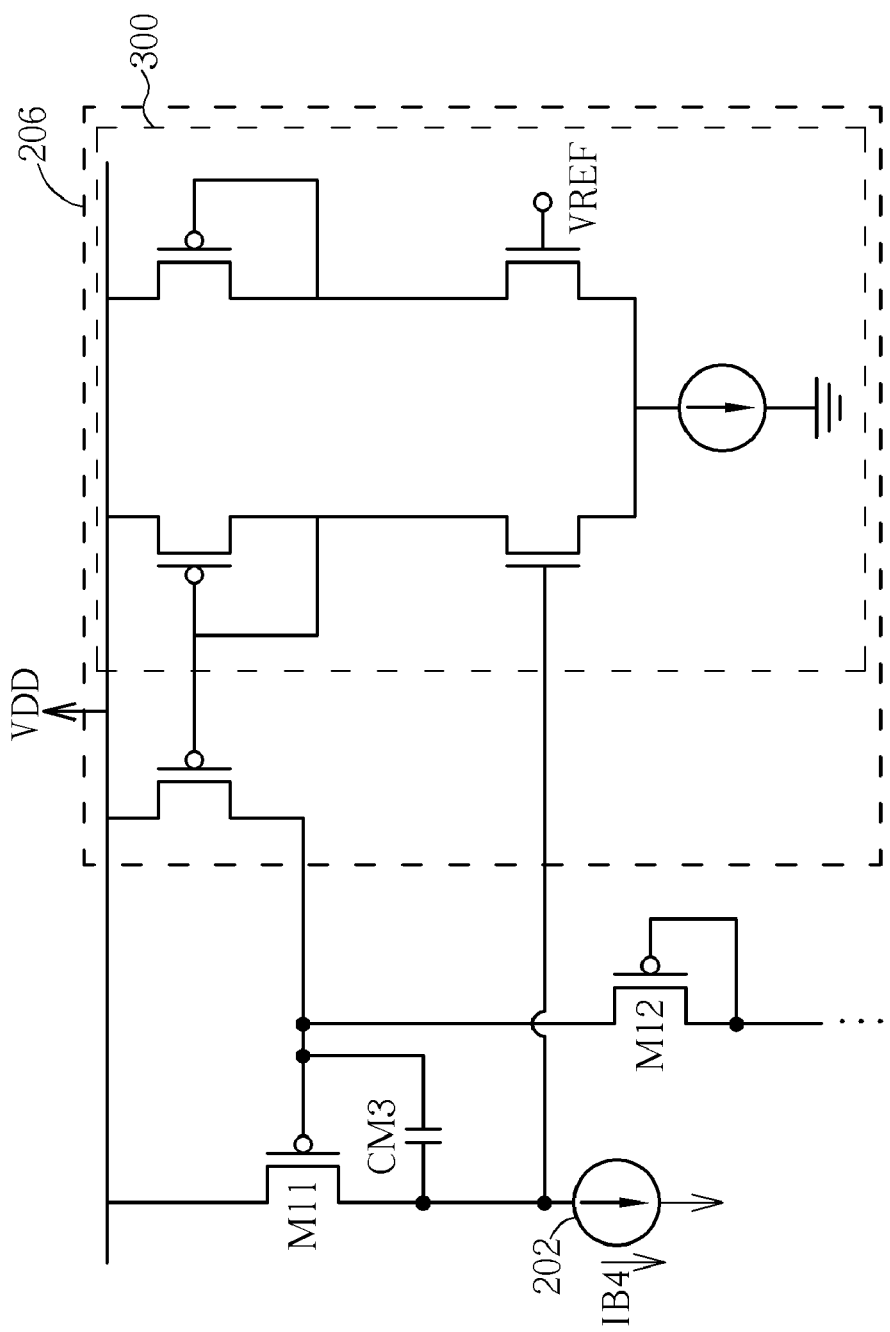
FIG. 3 is a schematic diagram of an output stage quiescent current controller in FIG. 2 according to an embodiment of the present invention.

For operations of the output stage quiescent current controller 206, please refer to FIG. 3, which is a schematic diagram of the output stage quiescent current controller 206 in FIG. 2 according to an embodiment of the present invention. The output stage quiescent current controller 206 includes an operational amplifier comparator 300. Input terminals of the operational amplifier comparator 300 are coupled to a source of the transistor M11 and a reference voltage VREF, respectively. Therefore, when the operational amplifier comparator 300 performs negative feedback, an output terminal of the operational amplifier comparator 300 can make a source voltage Vd11 of the transistor M11 equal to the reference voltage VREF via controlling a gate voltage Vg11 of the transistor M11. The reference voltage VREF is equal to half the system voltage VDD. As a result, since a source voltage Vd15 of the transistor M15, i.e. output voltage, is half the system voltage VDD when no signal is inputted into the input terminals Vin−', Vin+', and the source voltage Vd11 of the transistor M11 is equal to the reference voltage VREF as well as half the system voltage VDD, plus sources of both the transistor M11, M15 are connected to the system voltage VDD, the drain-to-source voltage Vds11 of the transistor M11 is equal to the drain-to-source voltage Vds15 of the transistor M15.

Figure 1:
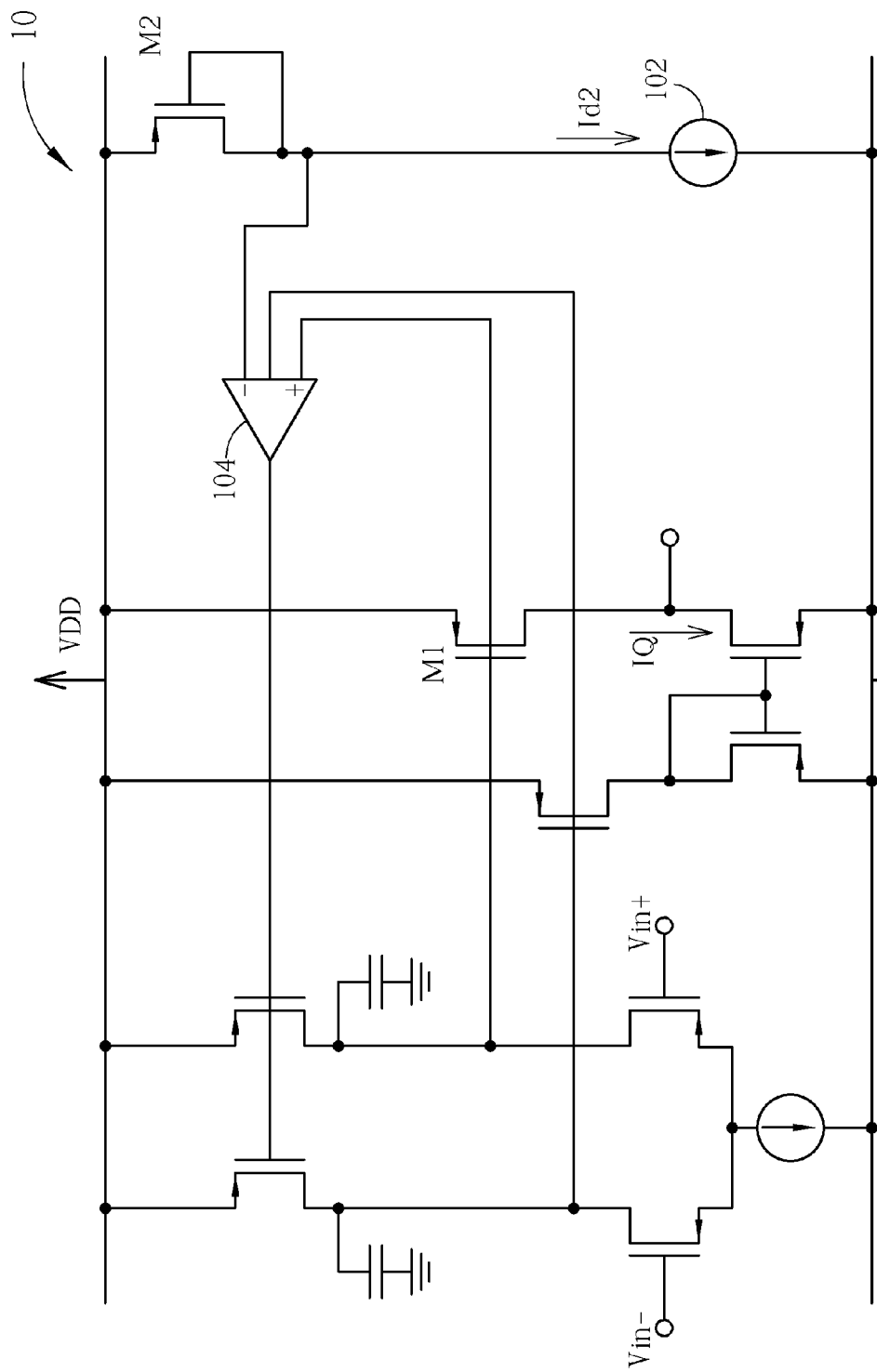
FIG. 1 is a schematic diagram of a class AB operational amplifier according to the prior art.
Figure 4A:
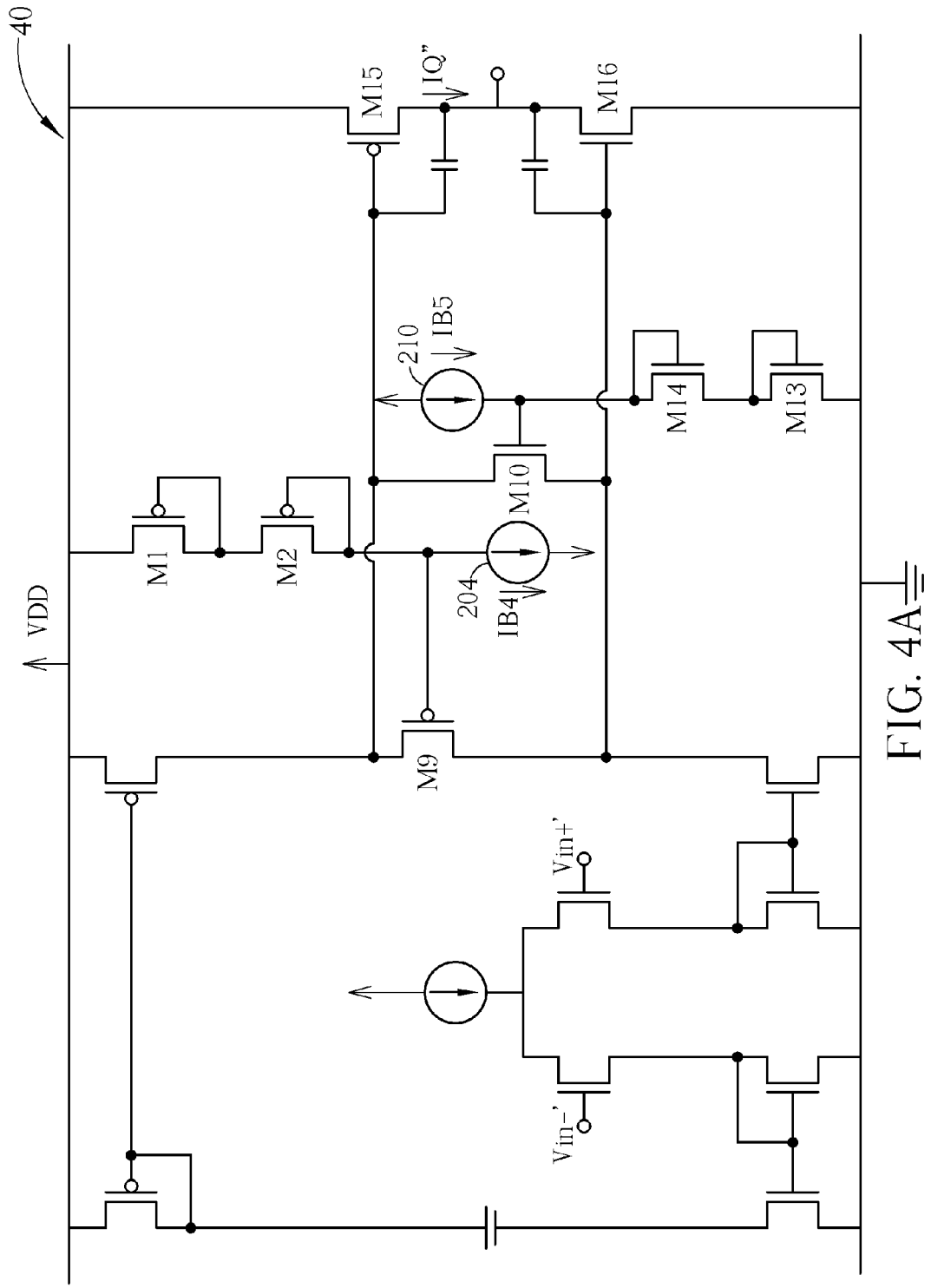
FIG. 4A is a schematic diagram of a class AB operational amplifier with operating principles similar to those of the class AB operational amplifier in FIG. 1.
Figure 4C:
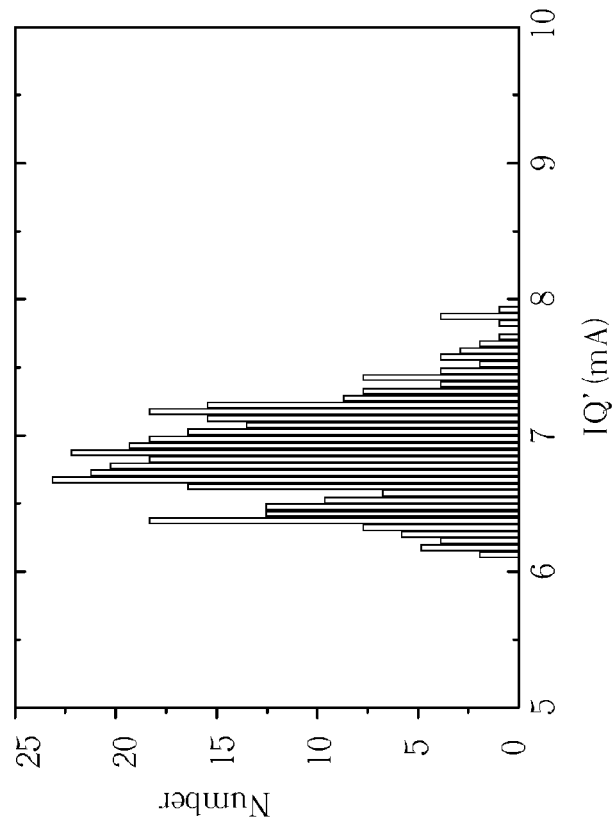
FIG. 4C is a schematic diagram of distribution of output stage quiescent currents of the class AB operational amplifiers in FIG. 2 under the same process conditions
Figure 4B:
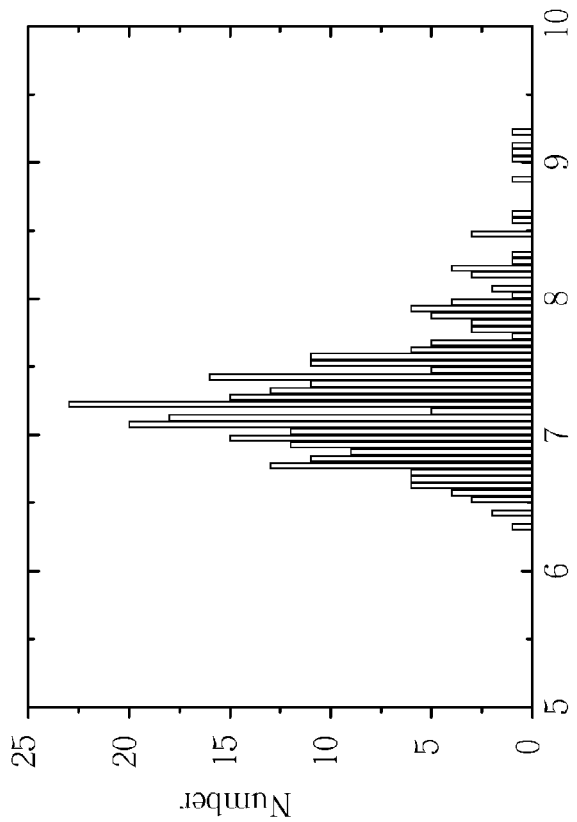
FIG. 4B is a schematic diagram of distribution of output stage quiescent currents of the class AB operational amplifiers in FIG. 4A under the same process conditions
Figure 4D:
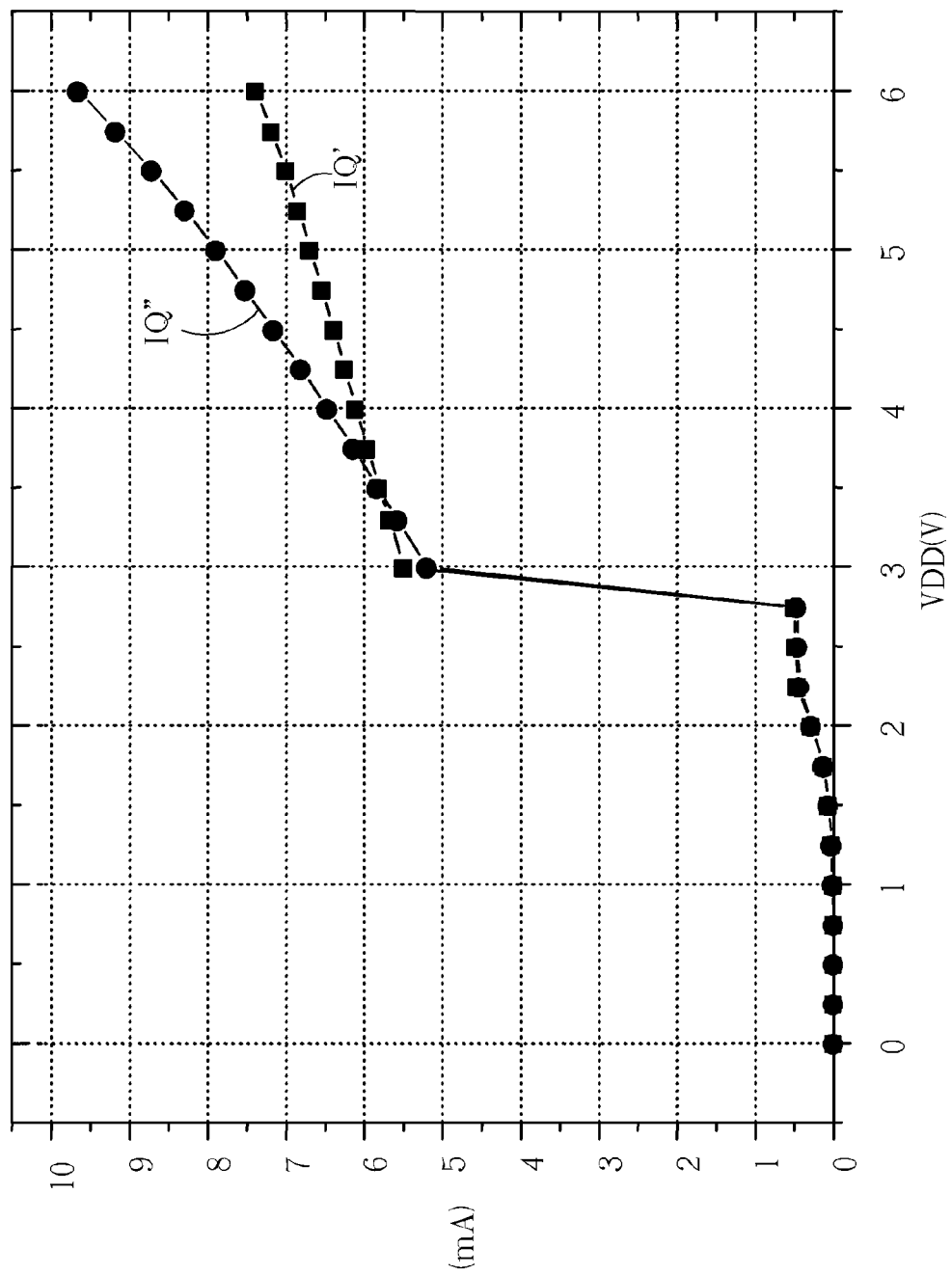
FIG. 4D is a schematic diagram of an output stage quiescent current in FIG. 4A and an output stage quiescent current in FIG. 2 under different system voltages.

For improvement of the class AB operational amplifier 20, please refer to FIG. 4A to FIG. 4D. FIG. 4A is a schematic diagram of a class AB operational amplifier 40 with operating principles similar to those of the class AB operational amplifier 10 in FIG. 1, FIG. 4B is a schematic diagram of distribution of output stage quiescent currents IQ'' of the class AB operational amplifiers 40 in FIG. 4A under the same process conditions, FIG. 4C is a schematic diagram of distribution of the output stage quiescent currents IQ' of the class AB operational amplifiers 20 in FIG. 2 under the same process conditions, and FIG. 4D is a schematic diagram of the output stage quiescent current IQ'' in FIG. 4A and the output stage quiescent current IQ' in FIG. 2 under different system voltages VDD. As shown in FIG. 4A, the class AB operational amplifier 40 is similar to the class AB operational amplifier 20, and thus elements and signals with the same functions are denoted by the same symbols for simplicity. Differences between the class AB operational amplifier 40 and the class AB operational amplifier 20 are that the class AB operational amplifier 40 does not include the output stage quiescent current controller 206, and the gate and the source of the transistor M11 are not separated by a capacitor CM3 as in the class AB operational amplifier 20. Therefore, in the class AB operational amplifier 40, the source voltage Vd11 is equal to the gate voltage Vg11, and the gate-to-source voltage Vgs11 is equal to the gate-to-source voltage Vgs15, while the drain-to-source voltage Vds11 is not equal to the drain-to-source voltage Vds15, i.e. operating principles are similar to those of the class AB operational amplifier 10 in the prior art. Thus, the output stage quiescent current IQ″ of the class AB operational amplifier 40 is similar to Eq. 4:

$$IQ'' = \frac{\left(\frac{W}{L}\right)_{15}(1+\lambda Vds15)}{\left(\frac{W}{L}\right)_{11}(1+\lambda Vds11)} IB4 = \frac{\left(\frac{W}{L}\right)_{15}}{\left(\frac{W}{L}\right)_{11}} \frac{(1+\lambda Vds15)}{(1+\lambda Vgs11)} IB4,$$ (Eq. 7)

Therefore, since the gate-to-source voltage Vgs11 and the process variation parameter λ, which are varied due to process variation, can be eliminated from the output stage quiescent current IQ′ of the class AB operational amplifier 20, the output stage quiescent current IQ′ does not vary significantly when both the gate-to-source voltage Vgs11 and the process variation parameter λ increase or decrease. As can be seen from FIG. 4B and FIG. 4C, compared with the class AB operational amplifiers 40 that do not include the output stage quiescent current controllers 206 under the same process conditions, distribution of the output stage quiescent currents IQ′ of the class AB operational amplifiers 20 under the same process conditions are more concentrated, while distribution of the output stage quiescent currents IQ″ of the class AB operational amplifiers 40 are wider. Furthermore, as shown in FIG. 4D, since the class AB operational amplifier 20 utilizes the output stage quiescent current controller 206 to control the drain-to-source voltage Vds11 to be equal to the drain-to-source voltage Vds15, for eliminating the channel length modulation effect, the output stage quiescent current IQ′ is increased by a lesser degree than the output stage quiescent current IQ″ when the system voltage VDD rises. As can be seen from the above, the present invention reduces variation of the output stage quiescent current IQ′ due to variation of the system voltage VDD and process variation, and maintains the output stage quiescent current IQ′ within a stable range.

Noticeably, the spirit of the present invention is to utilize the output stage quiescent current controller 206 to control the drain-to-source voltage Vds11 of the transistor M11 to be equal to the drain-to-source voltage Vds15 of the transistor M15, so as to reduce variation of the output stage quiescent current IQ′ due to variation of the system voltage VDD and process variation. Those skilled in the art should readily make modifications or alterations accordingly. For example, other than matching the transistors M9, M12 to make the gate voltage Vg9 equal to the gate voltage Vg11, methods similar to utilizing the comparator 104 to perform negative feedback in the prior art can be applied to make the gate voltage Vg9 equal to the gate voltage Vg11 as well. Realization of the output stage quiescent current controller 206 is not limited to the operational amplifier comparator 300 in FIG. 3, as long as the drain-to-source voltage Vds11 the transistor M11 can be equal to the drain-to-source voltage Vds15 of the transistor M15. Moreover, all of the transistors M9, M11, M12, M15 in the exemplary embodiment are realized by P-type metal oxide semiconductor (PMOS) transistors, and the exemplary embodiment can be realized by NMOS transistors such as the transistors M10, M13, M14, M16 with corresponding current sources 208, 210, a capacitor CM4 and an output stage quiescent current controller 212 as well. These modifications can be understood by referring to the above description, and are therefore not narrated hereinafter.

Figure 5:
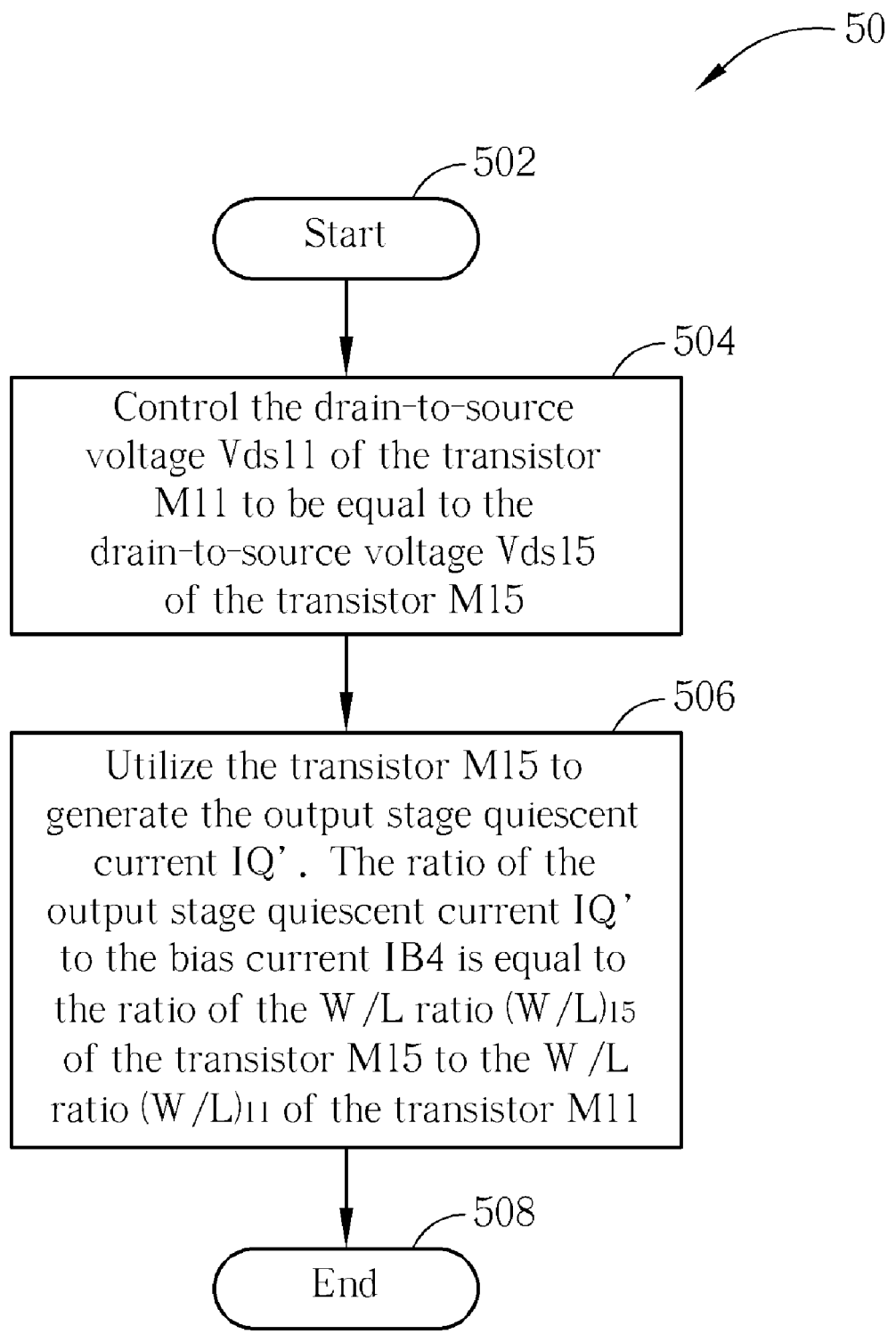
FIG. 5 is a schematic diagram of an output stage quiescent current control process according to an embodiment of the present invention.

Operations of the class AB operational amplifier 20 can be summarized into an output stage quiescent current control process 50 as shown in FIG. 5. The output stage quiescent current control process 50 includes the following steps:

Step 502: Start.

Step 504: Control the drain-to-source voltage Vds11 of the transistor M11 to be equal to the drain-to-source voltage Vds15 of the transistor M15.

Step 506: Utilize the transistor M15 to generate the output stage quiescent current IQ′. The ratio of the output stage quiescent current IQ′ to the bias current IB4 is equal to the ratio of the W/L ratio (W/L)15 of the transistor M15 to the W/L ratio (W/L)11 of the transistor M11.

Step 508: End.

The output stage quiescent current control process 50 can be understood by referring to the above description, and is therefore not detailed hereinafter.

The conventional class AB operational amplifier only controls the gate-to-source voltage Vgs11 of the transistor M11 to be equal to the gate-to-source voltage Vgs15 of the transistor M15, and thus the output stage quiescent current varies due to variation of the system voltage and process variation, and cannot be maintained within a stable range. In comparison, the class AB operational amplifier 20 in the present invention can utilize the output stage quiescent current controller 206 to control the drain-to-source voltage Vds11 of the transistor M11 to be equal to the drain-to-source voltage Vds15 of the transistor M15, so as to reduce variation of the output stage quiescent current IQ′ due to variation of the system voltage VDD and process variation.

Those skilled in the art will readily observe that numerous modifications and alterations of the device and method may be made while retaining the teachings of the invention.

What is claimed is:

1. A class AB operational amplifier, comprising:
   a first transistor, for generating a first current;
   a second transistor, where a second source voltage of the second transistor is equal to a first source voltage of the first transistor, for generating an output stage quiescent current; and
   an output stage quiescent current controller, coupled to a gate and a drain of the first transistor, for controlling a first drain-to-source voltage of the first transistor to be equal to a second drain-to-source voltage of the second transistor, and comprising:
      an operational amplifier comparator, for controlling a first drain voltage of the first transistor to be equal to a second drain voltage of the second transistor via negative feedback, comprising:
         a first input terminal, coupled to the drain of the first transistor;
         a second input terminal, for receiving a reference voltage, which is equal to the second drain voltage; and
         an output terminal, coupled to the gate of the first transistor;
   wherein a ratio of the output stage quiescent current to the first current is equal to a ratio of a second W/L ratio of the second transistor to a first W/L ratio of the first transistor.

2. The class AB operational amplifier of claim 1, wherein both the reference voltage and the second drain voltage are equal to half a system voltage.

3. The class AB operational amplifier of claim 1, further comprising:
   a third transistor, a source of the third transistor being coupled to a gate of the second transistor; and
   a fourth transistor, a source of the fourth transistor being coupled to a gate of the first transistor, and a gate of the fourth transistor being coupled to a gate of the third transistor;
   wherein a sum of a first gate-to-source voltage of the first transistor and a fourth gate-to-source voltage of the fourth transistor is equal to a sum of a second gate-to-source voltage of the second transistor and a third gate-to-source voltage of the third transistor.

4. The class AB operational amplifier of claim 3, wherein the third gate-to-source voltage is equal to the fourth gate-to-source voltage and the first gate-to-source voltage is equal to the second gate-to-source voltage.

5. The class AB operational amplifier of claim 3, wherein the first transistor, the second transistor, the third transistor and the fourth transistor are all P-type metal oxide semiconductor (PMOS) transistors or NMOS transistors.

6. An output stage quiescent current control method for a class AB operational amplifier, comprising:
   providing an operational amplifier comsparator, a first input terminal of the operational amplifier comparator being coupled to a drain of a first transistor, a second input terminal of the operational amplifier comparator for receiving a reference voltage, which is equal to a second drain voltage of a second transistor, and an output terminal of the operational amplifier comparator being coupled to a gate of the first transistor, wherein a second source voltage of the second transistor is equal to a first source voltage of the first transistor;
   controlling a first drain voltage of the first transistor to be equal to the second drain voltage of the second transistor via negative feedback, to control a first drain-to-source voltage of the first transistor to be equal to a second drain-to-source voltage of the second transistor; and
   utilizing the second transistor to generate an output stage quiescent current;
   wherein a ratio of the output stage quiescent current to a first current generated by the first transistor is equal to a ratio of a second W/L ratio of the second transistor to a first W/L ratio of the first transistor.

7. The output stage quiescent current control method of claim 6, wherein both the reference voltage and the second drain voltage are equal to half a system voltage.

8. The output stage quiescent current control method of claim 6, further comprising:
   providing a third transistor, a source of the third transistor being coupled to a gate of the second transistor; and
   providing a fourth transistor, a source of the fourth transistor being coupled to a gate of the first transistor, and a gate of the fourth transistor being coupled to a gate of the third transistor;
   wherein a sum of a first gate-to-source voltage of the first transistor and a fourth gate-to-source voltage of the fourth transistor is equal to a sum of a second gate-to-source voltage of the second transistor and a third gate-to-source voltage of the third transistor.

9. The output stage quiescent current control method of claim 8, further comprising controlling the third gate-to-source voltage equal to be equal to the fourth gate-to-source voltage and the first gate-to-source voltage to be equal to the second gate-to-source voltage.

10. The output stage quiescent current control method of claim 8, wherein the first tansistor, the are all P-type metal oxide semiconductor (PMOS) transistors or NMOS transistors.

* * * * *